United States Patent
Diep et al.

(10) Patent No.: US 9,095,076 B2
(45) Date of Patent: Jul. 28, 2015

(54) ELECTRONIC DEVICE ENCLOSURES AND HEATSINK STRUCTURES WITH THERMAL MANAGEMENT FEATURES

(71) Applicant: Apple Inc., Cupertino, CA (US)

(72) Inventors: Vinh Diep, Milpitas, CA (US);
Chiew-Siang Goh, San Jose, CA (US);
Doug Heirich, Palo Alto, CA (US);
Alexander Michael Kwan, Los Altos Hills, CA (US); Cesar Lozano Villarreal, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/271,353

(22) Filed: May 6, 2014

(65) Prior Publication Data

US 2014/0293545 A1    Oct. 2, 2014

Related U.S. Application Data

(63) Continuation of application No. 13/221,796, filed on Aug. 30, 2011, now Pat. No. 8,760,868.

(51) Int. Cl.
*H05K 7/20* (2006.01)
*H05K 13/00* (2006.01)
*G06F 1/20* (2006.01)

(52) U.S. Cl.
CPC ............ *H05K 7/20436* (2013.01); *H05K 13/00* (2013.01); *Y10T 29/49002* (2015.01)

(58) Field of Classification Search
CPC . H05K 7/20; H05K 7/20436; H05K 7/20445; H05K 7/20963; H05K 1/0203; H05K 1/021; H05K 5/0213; G06F 1/20; G06F 1/1601; G06F 1/1658; G06F 1/181

USPC .......... 361/679.01, 679.46–679.54, 704, 705, 361/709, 710, 714, 715, 719, 720–722; 175/15.1, 16.3, 50.52, 50.54, 520; 165/80.2, 80.3, 104.33, 185; 312/223.2, 223.3, 236; 157/706–727

See application file for complete search history.

(56) References Cited

U.S. PATENT DOCUMENTS 5,507,610 A * 4/1996 Benedetti et al. ............. 411/339
6,205,025 B1 * 3/2001 Chen ............................ 361/704

(Continued)

FOREIGN PATENT DOCUMENTS

TW          369168      9/1999
TW          M336472     7/2008

OTHER PUBLICATIONS

Taiwanese Patent Application No. 101131310—Office Action dated Oct. 8, 2014.

(Continued)

*Primary Examiner* — Michail V Datskovskiy
(74) *Attorney, Agent, or Firm* — Downey Brand LLP

(57) ABSTRACT

An electronic device may have a housing in which electronic components are mounted. The electronic components may be mounted to a substrate such as a printed circuit board. A heat sink structure may dissipate heat generated by the electronic components. The housing may have a housing wall that is separated from the heat sink structure by an air gap. The housing wall may have integral support structures. Each of the support structures may have an inwardly protruding portion that protrudes through a corresponding opening in the heat sink structure. The protruding portions may each have a longitudinal axis and a cylindrical cavity that lies along the longitudinal axis. Each of the support structures may have fins that extend radially outward from the longitudinal axis.

18 Claims, 4 Drawing Sheets

(56) References Cited

U.S. PATENT DOCUMENTS

| | | | |
|---|---|---|---|
| 6,384,331 B1 * | 5/2002 | Ku | 174/548 |
| 6,570,086 B1 * | 5/2003 | Shimoji et al. | 174/377 |
| 6,695,629 B1 * | 2/2004 | Mayer | 439/92 |
| 6,977,815 B2 | 12/2005 | Hsu | |
| 7,233,503 B2 * | 6/2007 | Chen | 361/804 |
| 7,983,057 B2 * | 7/2011 | Zheng et al. | 361/810 |
| 2008/0158817 A1 * | 7/2008 | Tsunoda et al. | 361/697 |
| 2010/0254078 A1 * | 10/2010 | Zheng et al. | 361/679.02 |
| 2012/0307455 A1 * | 12/2012 | Ritter et al. | 361/720 |

OTHER PUBLICATIONS

Australian Patent Application No. 2012300302—Office Action dated Dec. 8, 2014.

\* cited by examiner

ELECTRONIC DEVICE ENCLOSURES AND HEATSINK STRUCTURES WITH THERMAL MANAGEMENT FEATURES

CROSS-REFERENCE TO RELATED APPLICATIONS

This is a continuation of U.S. application Ser. No. 13/221,796 filed Aug. 30, 2011 entitled "Electronic Device Enclosures and Heatsink Structures with Thermal Management Features", which is incorporated herein by reference in its entirety.

BACKGROUND

This relates to electronic devices, and more particularly, to thermal management features for electronic devices.

Electronic devices contain electronic components that are mounted within housings. For example, an electronic device may contain integrated circuits. During operation, electronic components such as integrated circuits produce heat. If care is not taken, the heat from components in an electronic device may produce localized hot spots. The hot spots can make some portions of the housing of the device undesirably warm relative to other portions.

It would therefore be desirable to be able to provide improved housing configurations for electronic devices.

SUMMARY

An electronic device may have a housing in which electronic components are mounted. The electronic components may be mounted to a substrate such as a printed circuit board. During operation, the electronic components may generate heat.

A heat sink structure may be mounted adjacent to the electronic components to dissipate the heat generated by the electronic components. The housing may have a housing wall that is separated from the heat sink structure by an air gap.

The housing wall may have support structures that separate heat sink structure from the housing wall to produce the air gap. Each of the support structures may have a protruding portion that passes through a corresponding opening in the heat sink structure. The protruding portions may each have a longitudinal axis and a cylindrical cavity that lies along the longitudinal axis. A tip portion of each protruding portion may be bent using a heat staking process to attach the heat sink structure to the housing wall. Each of the support structures may have shoulder portions formed from fins that extend radially outward from the longitudinal axis.

Further features of the invention, its nature and various advantages will be more apparent from the accompanying drawings and the following detailed description of the preferred embodiments.

DETAILED DESCRIPTION

Figure 1:
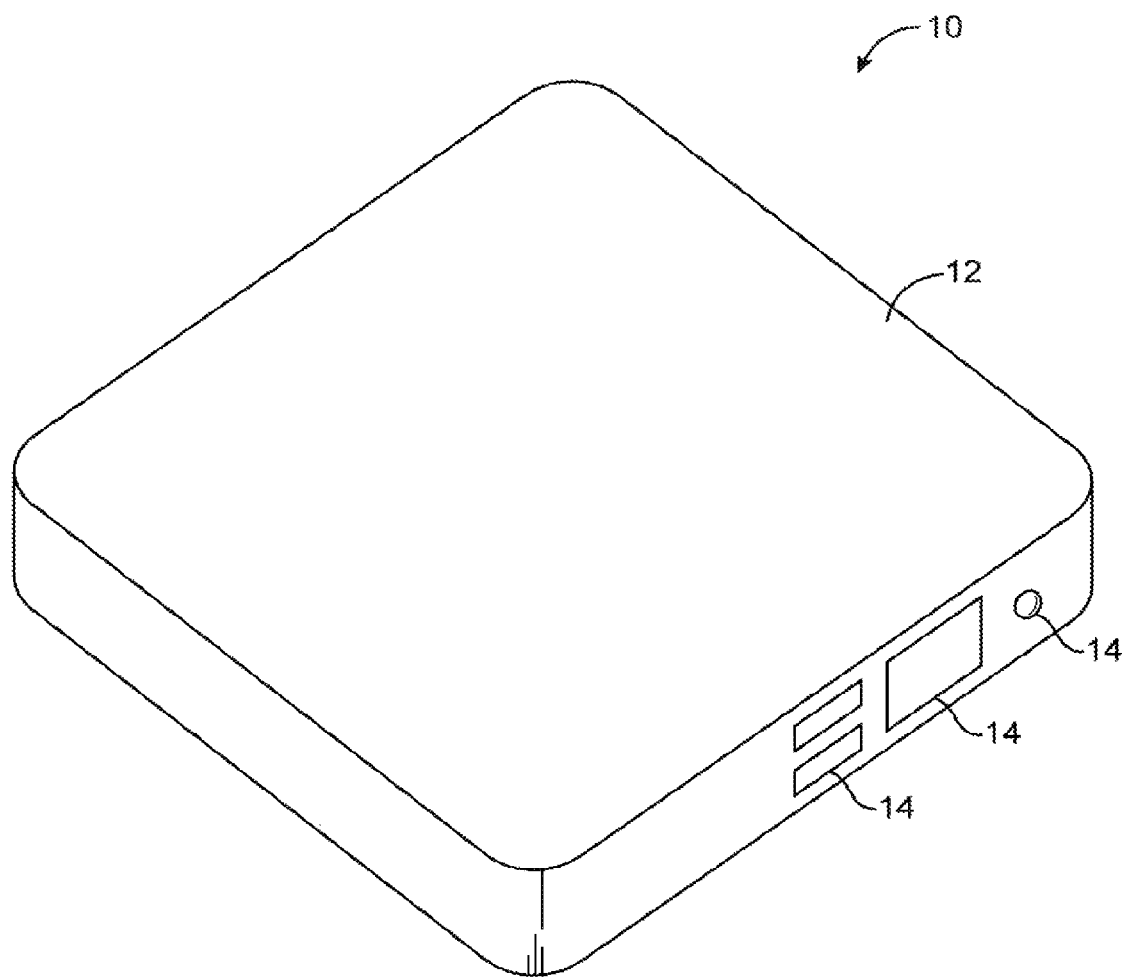
FIG. 1 is a perspective view of an illustrative electronic device in accordance with an embodiment of the present invention.

Thermal management features may be incorporated into an electronic device to control the flow of heat from internal device components. An illustrative electronic device of the type that may be provided with thermal management features is shown in FIG. 1. Electronic device 10 of FIG. 1 may be a computer, a set-top box, a wireless access point, a portable electronic device, or any other suitable electronic equipment. Configurations for electronic device 10 in which device 10 is implemented as a wireless access point are sometimes described herein as an example. This is, however, merely illustrative. Electronic device 10 may include any suitable type of electronic equipment if desired.

As shown in FIG. 1, electronic device 10 may have a housing such as housing 12. Housing 12 may be formed from materials such as plastic, glass, ceramic, metal, carbon fiber, fiberglass, and other fiber composites, other materials, or combinations of these materials. Housing 12 may have one or more parts. For example, housing 12 may have mating upper and lower parts formed from plastic or other housing materials. If desired, housing 12 may have more than two parts. In the configuration shown in FIG. 1, housing 12 has a rectangular box shape with planar upper and lower surfaces and four perpendicular (vertical) planar sidewalls. The corners of housing 12 may be rounded. Other shapes may be used for housing 12 if desired (e.g., shapes with curved sides, shapes with circular footprints, shapes with combinations of curved and straight edges and surfaces, etc.). The example of FIG. 1 is merely illustrative.

To accommodate connectors for displays, device peripherals, power cables, and other accessories, housing 12 may have openings (e.g., port openings) such as openings 14.

Device 10 may contain internal electronic components such as integrated circuits and other components that generate heat. Thermal management features may be incorporated into the structures of device 10 to control the flow of heat from the interior to the exterior of housing 12.

Figure 2:
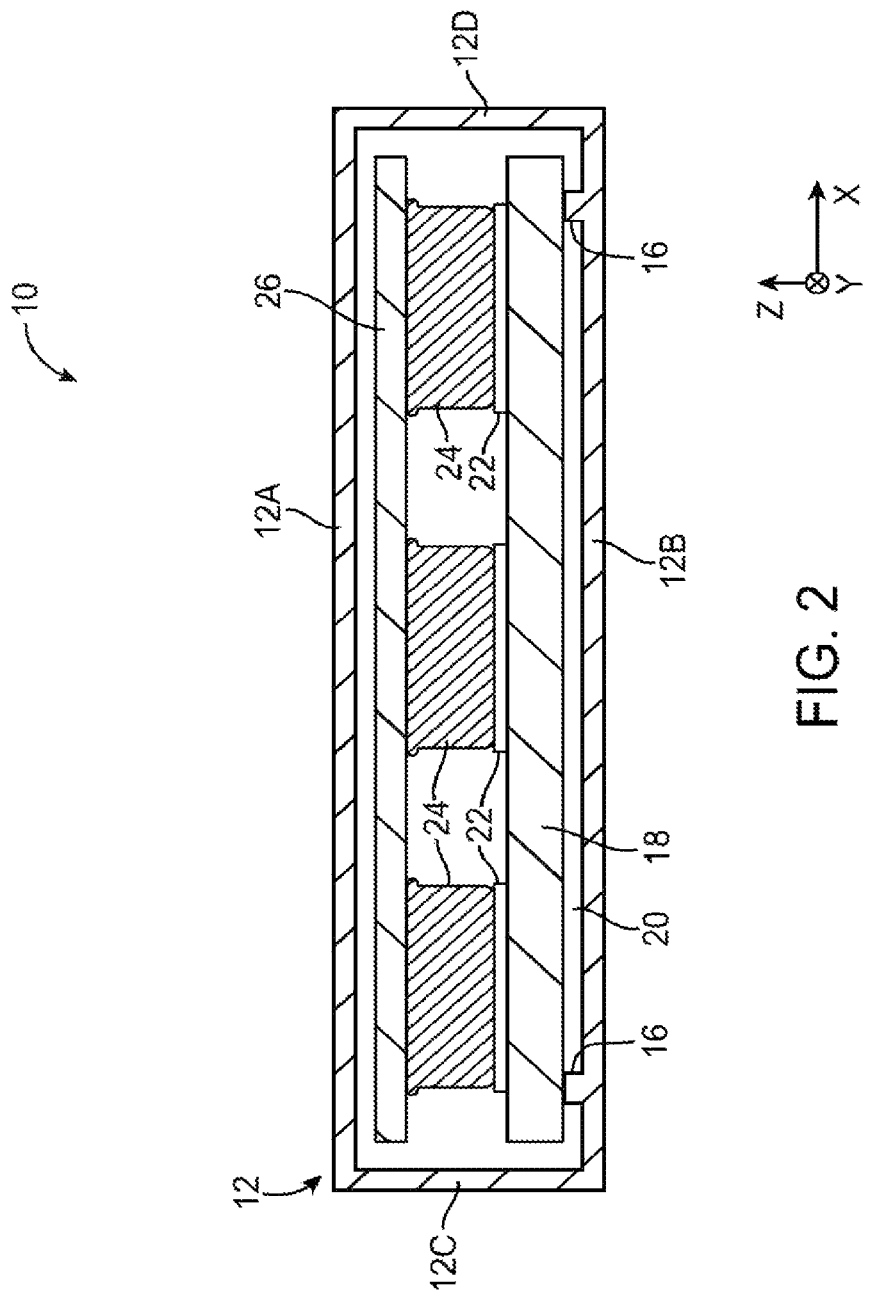
FIG. 2 is a cross-sectional side view of a device of the type shown in FIG. 1 showing how components may be mounted to a heat sink structure in a housing in accordance with an embodiment of the present invention.

A cross-sectional side view of an illustrative electronic device with thermal management features is shown in FIG. 2. As shown in FIG. 2, device 10 may have a housing 12 with planar upper housing wall 12A, planar lower housing wall 12B, and planar sidewalls such as left sidewall 12C and right sidewall 12D. Electrical components 24 may be mounted within housing 12. Electrical components 24 may include integrated circuits, switches, sensors, input-output devices, wireless circuits, discrete components such as resistors, capacitors, and inductors, power supply components, displays, audio components, and other electronic equipment. During operation, electrical components 24 may generate heat.

Electrical components 24 may be mounted on one or more substrates such as substrate 26. Substrates such as substrate 26 may be rigid printed circuit boards (e.g., printed circuit boards formed from fiberglass-filled epoxy such as FR4 printed circuit boards), flexible printed circuits ("flex circuits") formed from flexible sheets of polymer such as polyimide, printed circuit boards that contain both flexible and rigid portions (sometimes referred to as "rigid flex" boards), plastic, glass, ceramic, or other suitable substrate materials.

Components 24 may be electrically and mechanically connected to substrate structures 26 using solder, welds, conductive adhesive, fasteners, and other electrical and mechanical attachment mechanisms. In the example of FIG. 2, there are three components 24 mounted on a single substrate 26. In general, device 10 may contain any suitable number of components (e.g., one or more, five or more, ten or more, etc.) and any suitable number of substrates 26 (e.g., one or more, two or more, three or more, five or more, ten or more, etc.). When multiple substrates are used for mounting components 24, cables such as flex circuit cables and other interconnection structures may be used to route signals between different substrates 26. Components 24 may be mounted on one or both sides of substrate structures 26. In the example of FIG. 2, components 24 are mounted to the underside (inner side) of substrate 26. Components 24 may be mounted on the top side (outer side) of substrate 26 if desired.

Heat dissipation from components 24 may be promoted using one or more heat sinks As shown in FIG. 2, for example, one or more heat sinks such as heat sink 18 may be placed in contact with components 24 to dissipate heat produced by components 24. One heat sink 18 is shown in FIG. 2, but, in general, device 10 may contain any suitable number of heat sinks 18 (e.g., one or more, two or more, three or more, five or more, ten or more, etc.). The arrangement of FIG. 2 in which a single heat sink is used to dissipate heat from multiple components 24 is merely illustrative. If desired, each component 24 may be provided with an individual heat sink or heat sinks may be provided that are each used in dissipating heat from a respective subset of component 24 in device 10.

Heat sink structures 18 may be formed from one or more materials that exhibit satisfactory thermal conductivity. As an example, heat sink structures 18 may be formed from one or more metals such as aluminum (e.g., aluminum alloys), copper, etc. To enhance thermal transfer between components 24 and heat sink structures 18, high thermal conductivity materials may be placed between components 24 and heat sink structures 18 (e.g., conformal thermal pads, heat sink compound, etc.).

One or more air gaps may be formed between the outermost surfaces of heat sink structures 18 and the inner surfaces of housing 12. The air gaps may serve to retard heat flow from the interior of device 10 to the exterior of device 10. This retardation of heat flow may help ensure that heat is distributed laterally so that hot spots are reduced. Air gaps may be provided locally or may be provided globally (e.g., over most or all of the available surface of heat sink structures 18). In the example of FIG. 2, air gap 20 is formed globally between the lower (outermost) surface of heat sink structures 18 and the upper (innermost) surface of lower planar housing wall 12B. Other types of air gaps and air gaps of locally varying thickness may also be used. If desired, some or all of an air gap may also be filled with a material such as foam or low density plastic that has a low thermal conductivity instead of air. The example of FIG. 2 is merely illustrative.

With a configuration of the type shown in FIG. 2, heat that is locally produced in the vicinity of each component 24 travels into heat sink 18. Because of the presence of air gap 20, the heat in heat sink 18 tends to become evenly distributed laterally (in dimensions X and Y). Gap 20 may be sufficiently thin (e.g., 5 mm or less, 4 mm or less, 3 mm or less, 2 mm or less, 1 mm or less, etc.) to ensure that there is sufficient heat transfer outwards (in dimension Z) through housing wall 12B. This prevents the temperatures of components 24 from becoming too high during operation. The increase in the lateral spreading of heat within heat sink 18 that is produced by air gap 20 may ensure that there are few or no perceptible hot spots on housing 12 when the exterior of housing 12 is touched by a user. Air gaps 20 may be interposed between heat sink structures 18 and any suitable surfaces of housing 12 (e.g., between heat sink structures 18 and the upper surface of housing 12, between heat sink structures 18 and the lower surface of housing 12, between heat sink structures 18 and sidewall surfaces of housing 12, and/or between heat sink structures 18 and other suitable housing surfaces). The example of FIG. 2 in which there is one gap 20 adjacent to housing wall 12B is merely illustrative.

Air gaps such as air gap 20 may be created by supporting heat sink structures 18 with support structures such as support structures 16. Support structures 16 may be formed from part of heat sink structures 18, from housing structures such as part of housing 12, from internal frame structures, from combinations of these structures, or from other suitable structures. There may be any suitable number of support structures in device 10 (e.g., four so that each of four corners of a rectangular heat sink may be supported, six, eight, three or more, etc.). Support structures 16 may form spacers that serve to create a desired amount of separation for air gap 20. Support structures 16 may be formed from discrete structures that are attached to housing 12 or may be formed from part of housing 12.

Figure 3:
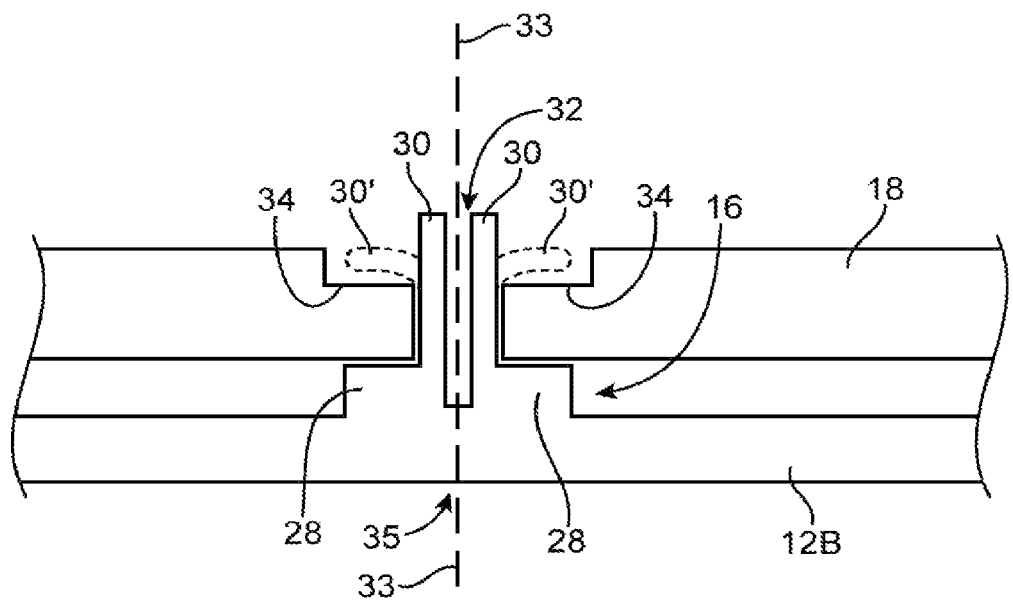
FIG. 3 is a cross-sectional side view of a portion of a heat sink structure and housing in the vicinity of a support structure that is used to heat stake the heat sink structure to the housing in accordance with an embodiment of the present invention.

With one suitable arrangement, which is sometimes described herein as an example, support structures 16 may be formed from integral protruding portions of housing wall 12. FIG. 3 is a cross-sectional side view of an illustrative support structure 16. As shown in FIG. 3, heat sink structures 18 may have openings through which portions 30 of support structures 16 protrude. For example, if there are four support structures 16 in device 10, heat sink structures 18 may have four corresponding openings for receiving respective portions 30 of the four support structures 16.

Support structures 16 may have shoulder structures 28 that support heat sink structures 18 and establish the size of air gap 20. Portions 30 may have the shape of a hollow cylinder. Cylindrical cavity 32 may run parallel to at least some of the length of support structures 16 along longitudinal axis 33 of portions 30. Portions 30 of support structures 16 may form a heat stake attachment structure that is deformed upon application of heat. In particular, the tips of portions 30 may be heated and bent downwards to positions 30' during application of heat to the tips of portions 30 in a heat staking process. In this position, heat stake portions 30 may be received within circular recess 34 of heat sink structures 18 to attach (heat stake) heat sink structures 18 to housing 12B. The presence of an internal cavity within the protruding cylindrical portion 30 of support structures 16 may help to reduce thermal transfer between heat sink 18 and housing 12B. In the absence of cavity 32, heat might be transferred from heat sink 18 to location 35 of housing 12B so effectively that location 35 of housing 12B might exhibit an unsightly heat-induced depression (sink mark).

Figure 4:
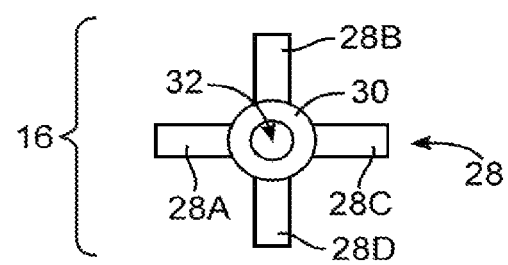
FIG. 4 is a top view of a heat stake support structure of the type shown in FIG. 3 in accordance with an embodiment of the present invention.

Localized thermal transfer between heat sink structures 18 and housing 12B can also be minimized by minimizing the footprint of shoulder portions 28 of support structures 16. With one suitable arrangement, the surface area on housing 12B that is consumed by shoulder portions 28 may be minimized by forming portions 28 in the shape of a set of fins that protrude radially outward from cavity 32 and longitudinal axis 33 of cavity 32. FIG. 4 is a top view of support structures 16 that have been formed using this type of approach. As shown in FIG. 4, portions 28 of support structures 16 may include four radially extending fins 28A, 28B, 28C, and 28D. Areas 35 between the fins are free of support structures 16. Because air is present in areas 35, thermal transfer through areas 35 and therefore through support structures 16 is minimized, reducing the likelihood of forming a sink mark under support structures 16. The FIG. 4 example includes four fins, but support structures 16 may have one or more fins, two or more fins, three or more fins, four or more fins, etc.

Figure 5:
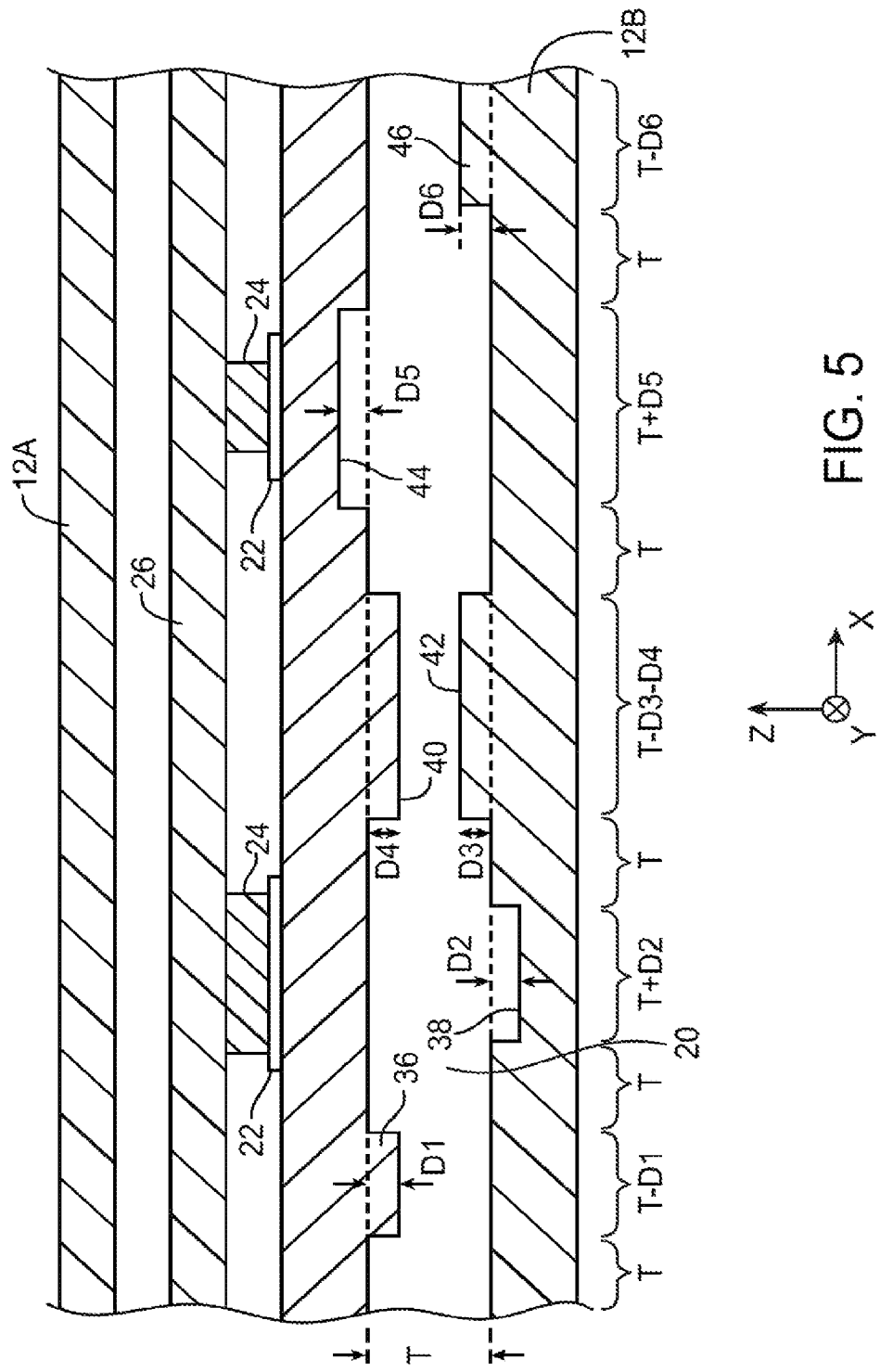
FIG. 5 is a cross-sectional side view of an illustrative electronic device housing and heat sink with recessed areas and protruding areas to manage the flow of heat from internal components in accordance with an embodiment of the present invention.

FIG. 5 is a cross-sectional side view showing how the thickness of air gap 20 may be adjusted locally to help evenly distribute heat on the exterior surface of housing 12. As shown in FIG. 5, the thickness of gap 20 may have different magnitudes in different locations. In some areas, the thickness of gap 20 may have a nominal thickness of T. In regions of device 10 where it is desired to decrease thermal resistance, the thickness of gap 20 may be locally decreased to a value below nominal thickness T. When it is desired to increase thermal resistance, the thickness of gap 20 may be increased to be larger than nominal thickness T. As an example, if it is desired to retard the flow of heat under a component that has an area of 1 cm$^2$, a 1 cm$^2$ area of device 10 that overlaps the component may be provided with an increased air gap thickness. If particular regions of device 10 are generating small amounts of heat, the thickness of air gap 20 may be reduced in those regions.

In the example shown in FIG. 5, air gap thickness adjustments have been made using combinations of recessed areas and protruding areas in heat sink structures 18 and in housing wall 12B.

In area T−D1, the thickness of air gap 20 has been decreased to a value of T−D1 by creating protrusion 36 in this area on the lower (outermost) surface of heat sink structures 16. Protrusion 36 has a thickness of D1, which reduces the thickness of air gap 20 by D1 over the area covered by protrusion 36.

In area T+D2, the thickness of air gap 20 has been increased to a value of T+D2 by creating recess 38 in this area on the upper (innermost) surface of housing wall 12B. Recess 38 has a depth of D2, which increases the thickness of air gap 20 by D2 throughout the area covered by recess 38.

In area T−D3−D4, an air gap thickness adjustment has been made using protrusions on both heat sink structures 18 and housing wall 12B. In particular, the thickness of air gap 20 has been decreased to a value of T−D3−D4 by creating protrusion 40 in this area on the lower (outermost) surface of heat sink structures 16 and by creating protrusion 42 on the upper (innermost) surface of housing wall 12B. Protrusion 40 has a thickness of D4 and protrusion 42 has a thickness D3, so there is an overall reduction in the thickness of air gap 20 from T to T−D3−D4 over the area covered by protrusions 40 and 42. Protrusions 40 and 42 may, for example, have the same surface area and may have identical footprints (as an example).

In area T+D5, the thickness of air gap 20 has been increased to a value of T+D5 by creating recess 44 in this area on the lower (outermost) surface of heat sink structure 18. Recess 38 has a depth of D2, which reduces the thickness of air gap 20 by D2 throughout the area covered by recess 44.

In area T−D6, the thickness of air gap 20 has been decreased to T−D6 by creating a protrusion on housing wall 12B having a thickness of D6.

These are merely illustrative configurations for forming thermal management features in device 10. In general, any suitable combinations of protrusions and recesses on housing walls 12 and/or heat sink structures 18 may be used to narrow and/or expand air gap 20 and thereby control the flow of heat through air gap 20 and the evenness with which heat spreads throughout dimensions X and Y before escaping outwards through housing 12 (housing wall 12B) in dimension Z. If desired, additional layers of material, protrusions on other surfaces of heat sink structures 18, housing walls 12, and/or other structures in device 10 may be used in controlling the flow of heat in device 10. Arrangements of the type shown in FIG. 5 are merely illustrative.

The foregoing is merely illustrative of the principles of this invention and various modifications can be made by those skilled in the art without departing from the scope and spirit of the invention.

What is claimed is:

1. An electronic device having an electrical component, the electronic device comprising:
    a housing having a housing wall, the housing wall having at least one support structure protruding from an internal surface of the housing wall, the housing wall continuous with the at least one support structure, the at least one support structure having a shoulder portion and a shaft portion that extends from a top surface of the shoulder portion; and
    a heat sink structure positioned between the housing wall and the electrical component and arranged to absorb heat generated by the electrical component, the heat sink structure having at least one opening that accepts the shaft portion of the at least one support structure, wherein the shoulder portion separates the housing wall from the heat sink structure by a gap corresponding to a height of the shoulder portion, the gap decreasing an amount of heat transferred from the electrical component to the housing wall.

2. The electronic device of claim 1, wherein the shoulder portion is arranged to support the heat sink structure.

3. The electronic device of claim 1, wherein the shaft portion aligns the heat sink structure with respect to the housing wall.

4. The electronic device of claim 1, wherein the shoulder portion has a larger width than the shaft portion.

5. The electronic device of claim 1, wherein the heat sink structure includes an upper surface and a lower surface, the at least one opening is disposed through both the upper surface and the lower surface.

6. The electronic device of claim 5, wherein a tip of the shaft portion extends above the upper surface of the heat sink structure.

7. The electronic device of claim 6, wherein the tip of the shaft portion is bent such that the tip secures the heat sink structure to the housing.

8. The electronic device of claim 1, wherein the shaft portion has a hollow cavity.

9. The electronic device of claim 1, wherein the shoulder portion includes a plurality of fins radially extending from the shaft portion.

10. The electronic device of claim 1, wherein the housing wall includes a sidewall adjacent the housing wall, wherein the at least one support structure is positioned a second distance from the sidewall.

11. A method of forming a heat dissipating assembly within a housing for an electronic device, the method comprising:
    forming a housing having a housing wall, the housing wall having at least one support structure protruding from an internal surface of the housing wall, the housing wall continuous with the at least one support structure, the at least one support structure having a shoulder portion and a shaft portion that extends from a top surface of the shoulder portion; and positioning a heat sink structure positioned between the housing wall and an electrical component and such that the heat sink structure absorbs heat generated by the electrical component, the heat sink structure having at least one opening that accepts the shaft portion of the at least one support structure, wherein the shoulder portion separates the housing wall from the heat sink structure by a gap corresponding to a height of the shoulder portion, the gap decreasing an amount of heat transferred from the electrical component to the housing wall.

12. The method of claim 11, wherein the heat sink structure includes an upper surface and a lower surface, the at least one opening is disposed through both the upper surface and the lower surface and wherein a tip of the shaft portion extends above the upper surface of the heat sink structure, the method further comprising:

bending a tip of the shaft portion such that the tip secures the heat sink structure to the housing.

13. The method of claim 11, wherein the positioning the heat sink structure comprises:

aligning the shaft portion of the at least one support structure with corresponding at least one opening.

14. The method of claim 11, wherein the positioning the heat sink structure comprises supporting the heat sink structure on shoulder portion of the at least one support structure.

15. An electronic device having a heat generating component, the electronic device comprising:

a housing having a housing wall, the housing wall having a plurality of support structures protruding from an internal surface of the housing wall, each of the support structures having a shoulder and a shaft that extends from a top surface of the shoulder, each of the shoulders including a plurality of fins radially extending from a corresponding shaft; and a heat sink structure positioned between the housing wall and the heat generating component and arranged to absorb heat generated by the heat generating component, the heat sink structure having a plurality of openings that accepts shafts of corresponding support structures such that the corresponding support structures cooperate to support the heat sink structure, wherein the shoulder separates the housing wall from the heat sink structure by a gap corresponding to a height of the shoulder, the gap decreasing an amount of heat transferred from the heat generating component to the housing wall.

16. The electronic device of claim 15, wherein the shafts of the plurality of support structures cooperate together to align the heat sink structure with respect to the housing wall.

17. The electronic device of claim 15, wherein each of the shafts includes a hollow cavity.

18. The electronic device of claim 15, wherein each of the plurality of support structures is continuous with the housing wall.

\* \* \* \* \*